United States Patent
Rubin

(10) Patent No.: US 6,429,062 B1
(45) Date of Patent: Aug. 6, 2002

(54) INTEGRATED-CIRCUIT MANUFACTURING USING HIGH INTERSTITIAL-RECOMBINATION-RATE BLOCKING LAYER FOR SOURCE/DRAIN EXTENSION IMPLANT

(75) Inventor: Mark E. Rubin, San Jose, CA (US)

(73) Assignee: Koninklike Philips Electronics N.V., Eindhoven (NL)

(*) Notice: Subject to any disclaimer, the term of this patent is extended or adjusted under 35 U.S.C. 154(b) by 0 days.

(21) Appl. No.: 09/400,610

(22) Filed: Sep. 20, 1999

(51) Int. Cl.[7] .......................................... H01L 21/8238
(52) U.S. Cl. ........................ 438/199; 438/231; 438/232; 438/301; 438/305; 438/306
(58) Field of Search ................................. 438/199, 231, 438/232, 301, 305, 306

(56) References Cited

U.S. PATENT DOCUMENTS

| | | | |
|---|---|---|---|
| 5,677,224 A | * 10/1997 | Kadosh et al. | 437/57 |
| 5,972,760 A | * 10/1999 | Ju | 438/305 |
| 6,078,080 A | * 6/2000 | Kadosh et al. | 257/344 |
| 6,124,158 A | * 9/2000 | Dautartas et al. | 438/216 |

OTHER PUBLICATIONS

C.S. Rafferty, H.H. Vuong, S.A. Eshraghi, M.D. Giles, M.R. Pinto, S.J. Hillenius, "Explanation of Reverse Short Channel Effect by Defect Gradients" IEDM, 1993, pp. 12.6.1–12.6.4.

M.E. Rubin, S. Saha, J. Lutze, F. Nouri, G. Scott, and D. Pramanik, in "Interface Interstitial Recombination Rate and the Reverse Short Channel Effect" Materials Research Society Symposium Proceedings, vol. 568, 1999, pp. 213–218

* cited by examiner

Primary Examiner—John F. Niebling
Assistant Examiner—Lynne A. Gurley
(74) Attorney, Agent, or Firm—Peter Zawilski

(57) ABSTRACT

In the fabrication of a 0.10 micron CMOS integrated circuit, a high-energy plasma etch is used to pattern a polysilicon layer and an underlying gate oxide layer to define gate structures. A thermal oxide step anneals silicon exposed and damaged by this etch. Instead of using this thermal oxide as a blocking layer for a source/drain extension implant, it is removed so as to expose the silicon surfaces of the source/drain regions. A TEOS deposition results in a carbon-bearing silicon dioxide layer in contact with the surfaces of the crystalline source/drain regions. A boron PMOS source/drain extension implant is performed through this carbon-bearing blocking layer. Subsequent steps result in the formation of sidewall spacers, heavily doped source/drain sections, submetal dielectric, an intermetal dielectric interconnect structure, and passivation. The relatively high interstitial recombination rate of the carbon-bearing blocking layer attracts a flow of interstitial silicon. This flow draws some of the boron extension implant with it—effectively limiting the depth and lateral extension (under the gate) of the boron. This, in turn, helps limit the short channel effect, and yields a more reliable 0.1 micron PMOS transistor.

10 Claims, 4 Drawing Sheets

┌─────────────────────┐
│ PRELIMINARY STEPS   │
│ THROUGH PATTERNING  │
│      GATES          │
│       S1            │
└──────────┬──────────┘
           │
           ▼
┌─────────────────────┐         ┌─────────────────────┐
│ THERMAL OXIDATION/  │         │   FORM SIDEWALL     │
│      ANNEAL         │         │      SPACERS        │
│       S2            │         │       S6            │
└──────────┬──────────┘         └──────────┬──────────┘
           │                               │
           ▼                               ▼
┌─────────────────────┐         ┌─────────────────────┐
│   STRIP THERMAL     │         │   TEOS DEPOSITION   │
│      OXIDE          │         │    OVER OXIDE       │
│       S3            │         │       S7            │
└──────────┬──────────┘         └──────────┬──────────┘
           │                               │
           ▼                               ▼
┌─────────────────────┐         ┌─────────────────────┐
│   TEOS DEPOSITION   │         │   DEEP SOURCE/DRAIN │
│ ON EXPOSED SILICON  │         │      IMPLANT        │
│       S4            │         │       S8            │
└──────────┬──────────┘         └──────────┬──────────┘
           │                               │
           ▼                               ▼
┌─────────────────────┐         ┌─────────────────────┐
│   SOURCE/DRAIN      │         │       METAL         │
│ EXTENSION IMPLANT   │         │   INTERCONNECT      │
│       S5            │         │     FORMATION       │
└─────────────────────┘         │       S9            │
                                └─────────────────────┘
```

INTEGRATED-CIRCUIT MANUFACTURING USING HIGH INTERSTITIAL-RECOMBINATION-RATE BLOCKING LAYER FOR SOURCE/DRAIN EXTENSION IMPLANT

BACKGROUND OF THE INVENTION

The present invention relates to integrated-circuit manufacturing and, more particularly, to a method for forming MOS transistors. A major objective is to provide shallower PMOS source/drain extension regions.

Much of modern progress is associated with the increasing prevalence of computers, which, in turn, has been made possible by advances in integrated-circuit manufacturing technology. These advances have allowed ever-smaller circuit elements to be fabricated, providing for faster speeds and greater functional density. Each reduction in circuit element sizes poses a new set of challenges to be addressed.

One prevalent technology is CMOS—which stands for "complementary metal-oxide-silicon. "Complementary" refers to the usage of two opposing types of transistors—NMOS and PMOS. In either type, a gate voltage controls conduction between a source and a drain. The conduction is along a "channel" that is spaced from the gate by a silicon dioxide layer, referred to as a "gate oxide". The sources and drains are defined by introducing an appropriate dopant into crystalline silicon regions. In the case of an NMOS transistor, the source and drain are formed using n-type dopants (which provide electrons as current carriers); in the case of a PMOS transistor, the source and the drain are formed using p-type dopants (which provide electron-holes as current carriers).

For each transistor, the channel separates the source and the drain from each other. To reduce what is known as a "hot-carrier effect", each source and each drain can include a lightly-doped extension that separates a respective heavily doped "deep" source/drain region from the channel. The channel then separates the source extension from the drain extension (also known as a "lightly doped drain" or "LDD").

A CMOS transistor operates by controlling the carrier population in and below the channel. In the case of an NMOS transistor, application of a positive gate voltage tends to deplete the channel of negative-charge carriers, namely, electrons, and attract to the channel positive-charge carriers, namely, electron holes. In the case of a PMOS transistor, application of a negative gate voltage tends to deplete the channel of positive-charge holes and attract negative-charge electrons.

The effect of a given voltage varies inversely with the volume of a gate region in and below the channel. The gate region corresponds to the channel region less depletion regions associated with the p/n boundaries that lie between the channel region and the source and drain extensions. The deeper the source/drain extension regions and the more the source/drain extension regions extend under the gate, the lower the gate-region volume that must be controlled by the gate voltage.

A typical integrated-circuit manufacturing method is described below. A gate oxide layer is deposited on crystalline silicon and polysilicon is deposited on the gate oxide. These two layers are photolithographically patterned using a high-energy plasma etch; this defines the transistor gate. Oxide is then grown on the silicon exposed by the etch to anneal damage due to the plasma. A relatively light implant is performed to define the source and drain extensions.

After some intermediate processing steps, silicon dioxide is deposited over the integrated-circuit structure and anisotropically etched to leave sidewall spacers. Additional silicon dioxide deposited. A heavy source/drain implant is performed through the deposited silicon. The gate sidewall spacers ensure that the heavily doped deep source/drain regions do not extend as far under the gate as the lightly doped source/drain regions do. Finally, a submetal dielectric layer is added and an interconnect structure is formed to connect the transistors.

As device dimensions shrink, control over each of the process steps becomes more critical. In particular, the source/drain extension implant must be carefully controlled. If the extension implant is too deep and/or extends to far under the gate, the gate-region volume is reduced. In this case, the transistor reacts too sensitively to (e.g., noise-induced) voltage variations so that device operation is unreliable. The reduced gate threshold voltage due to reduced gate depletion regions is known as the "short-channel effect".

NMOS transistors are afflicted by a "reverse short-channel effect", a seemingly paradoxical increase in threshold voltage for short-channel MOS transistors. C. S. Rafferty, H. H. Vuong, S. A. Eshraghi, M. D. Giles, and M. R. Pinto, S. J. Hillenius in "Explanation of Reverse Short Channel Effect by Defect Gradients", IEEE IEDM (International Electronics Device Meeting) 1993, p. 311–314, have shown that the reverse short-channel effect is due to a channel impurity flux to the surface due to surface recombination of interstitials under the gate. In fact, M. E. Rubin, S. Saha, J. Lutze, F. Nouri, G. Scott, and D. Pramanik, in "Interface Interstitial Recombination Rate and the Reverse Short Channel Effect" Materials Research Society Symposium Proceedings, Vol. 568, 1999, pp. 213–218, show that adding nitrogen to the gate oxide to reduce the interstitial recombination rate reduces the gate threshold voltage.

On the other hand, the (non-reverse) short-channel effect remains a concern. In principal, it can be addressed using precisely controlled shallow implants. A shallow implant can be achieved using low implant energies; precise control can be achieved removing atoms in the implant beam with energies that vary too much from the nominal implant energy. Such filtering can be achieved by magnetically bending an implant beam and physically selecting for implanting only those atoms that bend an amount corresponding to the desired implant energy.

Precise filtering is most readily achieved with high energy implants. Implant energy correlates with implant depth and with the atomic mass of the implant species.

Returning to the (non-invasive) short-channel effect, it can be addressed by using lower energy implant beams to reduce implant penetration into the silicon crystal substrate. The implants require filtering to remove unwanted energy ranges from the implant beam. This filtering can be performed by bending an implant beam and removing beam components that do not bend at an appropriate rate (because the components have particles heavier or lighter than the particles desired for the implant.)

The filtering of unwanted energy ranges is most effective for higher energy implants. The energy associated with a given implant correlates positively with the desired depth of the implant and the atomic mass of the implant species. Thus, depth control for shallow implants of light dopants is problematic, requiring more expensive and more complex equipment.

Boron, the prevalent p-type dopant, is also relatively light. Thus, control over shallow p-type implants is problematic.

This makes the short-channel effect a serious concern for sub 0.2 micron PMOS transistors. While implant depth control can be enhanced.

The filtering is most selective for higher energies. At low energies it becomes more difficult to filter out unwanted energy ranges, and thus control the implant depth. For a given desired implant depth, using more complex procedures and more expensive filtering equipment, a simpler, more economical, and more reliable method of controlling spacer depth for PMOS transistors is desired.

SUMMARY OF THE INVENTION

The present invention provides for implanting through a blocking layer of material that promotes interstitial recombination at its interface with crystalline silicon better than does a conventionally grown oxide layer. For example, the blocking layer can be of carbon-bearing silicon dioxide such as that resulting from a TEOS oxide deposition. The invention applies most favorably to boron or other p-type source/drain extension implants for a PMOS transistor.

The method can begin with the formation of a gate oxide layer and then deposition of a polysilicon layer. A plasma etch can be used to pattern these layers to define gates and so that the silicon of intended source/drain regions is exposed. Oxide can be grown on the exposed silicon to anneal surface damaged in the plasma etch.

Conventionally, this oxide is used as the blocking layer for the source/drain extension implants. The present invention calls for replacing this thermally-grown oxide with a layer that more strongly promotes interstitial recombination at the crystal silicon interface. To this end, the oxide growth is removed to again expose the silicon over the intended source/drain regions. The source/drain extension blocking layer is formed by depositing (e.g., using a TEOS deposition) silicon dioxide on the exposed silicon. The source/drain extension dopant (at least the p-type dopant for a PMOS transistor) is then performed through the blocking layer.

It is within the scope of the invention for silicon dioxide to form incidentally on the exposed silicon before the blocking layer is deposited. However, minimizing any such incidental growth is desired to enhance the effectiveness of the invention. The invention also provides for various intermediate steps; for example, a halo implant can be implemented after the extension implant and prior to formation of gate sidewall spacers.

After the extension implant is deposited, oxide spacers can be formed on the gate structures. A further TEOS deposition can be used to define a blocking layer for the heavily doped source/drain regions. A heavy source/drain implant can be performed through this second blocking layer. If the second blocking layer is deposited on a thickness of the first window, then the implant is performed through both blocking layers.

By way of explanation and not of limitation, the following mechanism is offered for some advantages of the invention. The replacement of the thermally-grown oxide with the blocking layer results in an increase in the number of interstitial recombination sites at the silicon surface adjacent the blocking layer. Interstitial silicon atoms drawn into the sites, e.g., during thermal drive-in, leave vacancies into which other interstitial silicon atoms are drawn. Cumulatively, there is a flow of interstitial silicon atoms toward the silicon surface where it interfaces the blocking layer. Correspondingly, there is less interstitial flow away from the surface (downward) or toward surface regions (such as the gate) covered with thermally-grown oxide. "Transient enhanced diffusion" refers to the net diffusion of interstitial silicon toward the recombination sites that occurs until the sites are occupied.

The flow of silicon atoms under transient enhanced diffusion carries with it other interstitial species. Specifically, implant species, and especially, relatively small implant species such as boron, are drawn toward the silicon interface with the blocking layer. The transient enhanced diffusion counters the tendency of the dopant to diffuse downwardly and laterally. The result is a shallower and more laterally confined dopant profile. Accordingly, there is less vulnerability to the short-channel effect.

Implementation of the invention is not cost-free. In general, it is still necessary to grow a thermal oxide to anneal the silicon after the gate etch. It is efficient to use this oxide growth or at least leave it in place during the extension implant. However, as the need to limit the depth and lateral extent of dopant diffusion increases (as it does with decreasing feature sizes), replacing the thermally grown oxide to achieve a higher interstitial recombination rate becomes more cost-effective.

The present invention provides an alternative to the more complex procedures and more expensive equipment required for low-energy implants. The invention does not require any special equipment, since the TEOS deposition is required at other stages of integrated-circuit manufacture. Furthermore, the invention provides for further improvements in dopant profile control even when such equipment and procedures are employed. These and other features and advantages of the invention are apparent from the description below with reference to the following drawings.

BRIEF DESCRIPTION OF THE DRAWINGS

FIG. 1 is a flow chart of a method of fabricating an integrated circuit in accordance with the present invention.

DETAILED DESCRIPTION OF THE PREFERRED EMBODIMENTS

In accordance with the present invention, the fabrication of a 0.1 micron CMOS integrated circuit includes a method M1 flow charted in FIG. 1. Preliminary multi-part step S1 provides for processing up through gate formation. A first series of substeps applies to a crystalline silicon substrate. These substeps can include: 1) formation of trenches to isolate transistors to be formed, 2) formation of p-wells in which NMOS transistors are to be formed, and 3) formation of n-wells in which PMOS transistors are to be formed.

A second series of substeps provides for forming gate structures on the substrate. A gate oxide is grown in an oxygen environment with a small percentage of nitrogen. Some nitrogen gets embedded in the gate oxide. This nitrogen subsequently limits the reverse short-channel effect as shown by Rubin et al. (cited above). The gate polysilicon is deposited. The polysilicon can be doped to increase its conductivity. A gate pattern is developed in a photolithographic mask. The mask pattern is transferred to the polysilicon layer and the gate oxide layer using a high-energy plasma etch.

Figure 2:
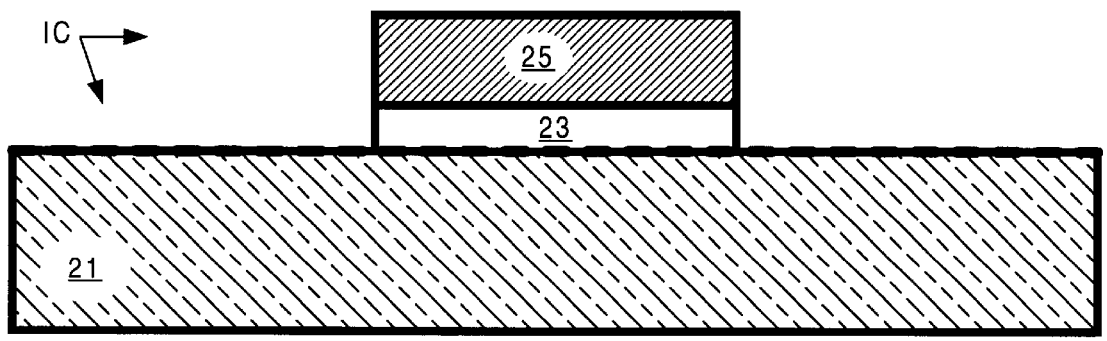
FIGS. 2–9 illustrate a succession of stages in the fabrication of the integrated circuit in accordance with the method of FIG. 1. In these figures, silicon is represented by alternating solid and dashed hatching. Positively doped silicon has positively sloped hatching and negatively doped silicon has negatively sloped hatching. Polysilicon is represented by solid hatching. Thermally grown silicon is unhatched. Deposited carbon-bearing silicon is shown with dashed hatching.

The structure resulting from preliminary step S1 is shown in FIG. 2. At this stage in processing, an integrated circuit IC, includes a substrate 21, a gate oxide 23, and a polysilicon gate 25. While integrated circuit IC eventually will holds millions of PMOS and NMOS transistor, only the region associated with one PMOS transistor is illustrated for clarity.

Figure 3:
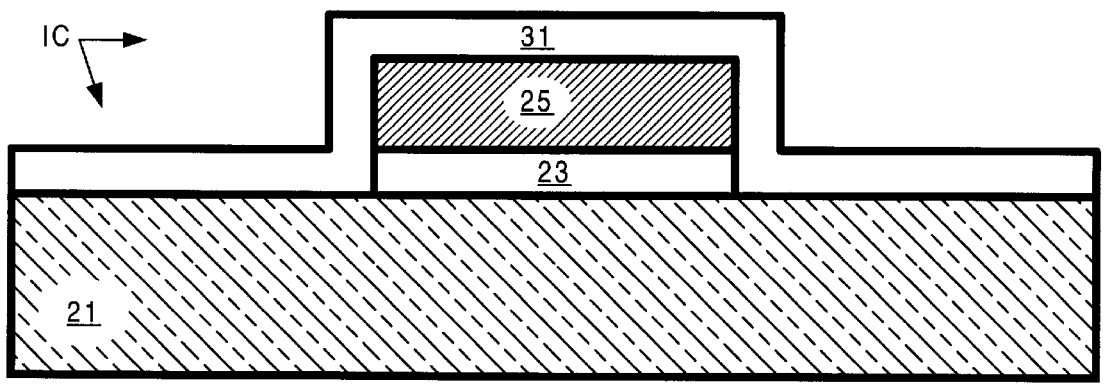

As indicated in FIG. 2, the energetic ions of the plasma used to etch the gate polysilicon and the gate oxide damage the exposed silicon surfaces. To anneal and repair the silicon surface, a silicon dioxide layer is thermally grown to anneal the silicon surface at step S2. The resulting structure includes this thermal oxide layer 31, as shown in FIG. 3.

Figure 4:
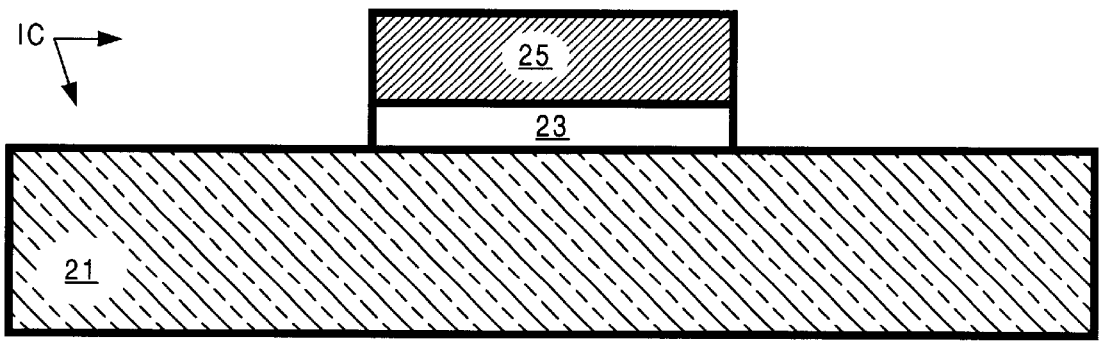

Methods not incorporating the invention typically use such a thermal oxide layer as an implant blocking layer for the source/drain extension implant. However, the present invention provides for replacing this thermally grown oxide layer with an oxide layer with a higher interstitial recombination rate. To this end, a wet chemical etch is used to remove the thermal oxide layer 31 at step S3. The resulting structure is shown in FIG. 4.

Figure 5:
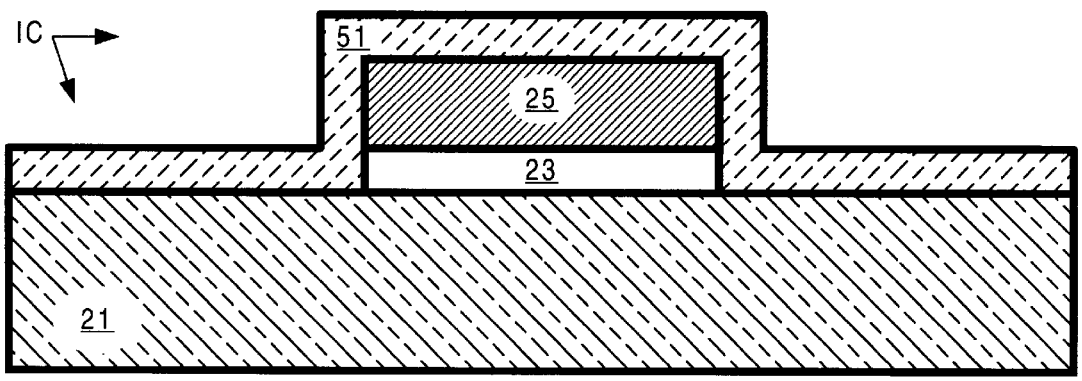

The thermal oxide is replaced by a carbon-bearing silicon dioxide layer in step S4. A TEOS deposition results in a carbon-bearing silicon dioxide blocking layer 51, as shown in FIG. 5, in contact with the surface of source and drain regions of silicon substrate 21. Efforts are made to minimize opportunity for reoxidation of the silicon surface between the etch of step S3 and the deposition of step S4. Any oxide growth in place as the TEOS deposition is begun may limit interstitial recombination, and thus control over dopant diffusion.

Source/drain extension implants are performed at step S5. Separate masks are used for the PMOS and NMOS transistors. For each implant, the energy is selected so that the bulk of the respective dopant is implanted just below the silicon surface. Step S5 involves implanting boron B into the source/drain regions of the PMOS transistors and arsenic (or phosphorous) into the source/drain regions of the NMOS transistors. Step S5 can also provide for an oblique "halo" implant of complementary dopant (boron for NMOS, arsenic or phosphorous for PMOS) under the gate to help counter the short-channel effect.

Figure 6:
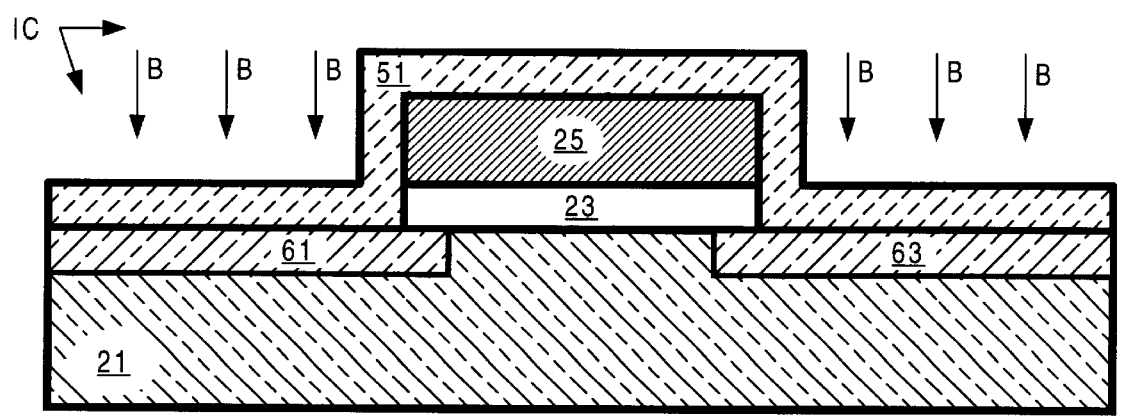

Step S5 can also provide for thermal "drive-in" of the dopants. Elevated temperatures increase the mobility of atoms entrained in the silicon crystal lattice. Initially, dopants diffuse in all directions. However, as interstitial silicon migrates into the TEOS layer, it sweeps other dopants, particularly boron (which comprises relatively small atoms), with it. As a result, the boron is confined closer to the TEOS covered silicon surface than it would be if a material, such as a thermal oxide, with a lower interstitial recombination rate were used. The post-diffusion extents of the source extension 61 and a drain extension 63 are shown in FIG. 6.

Figure 7:
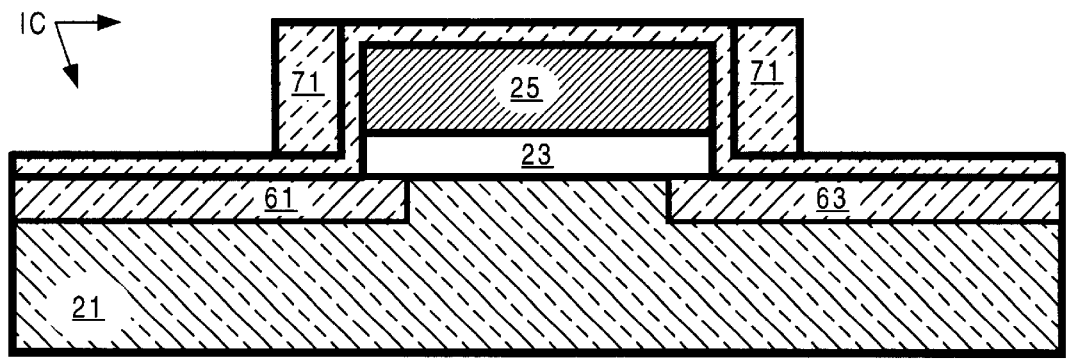
Figure 8:
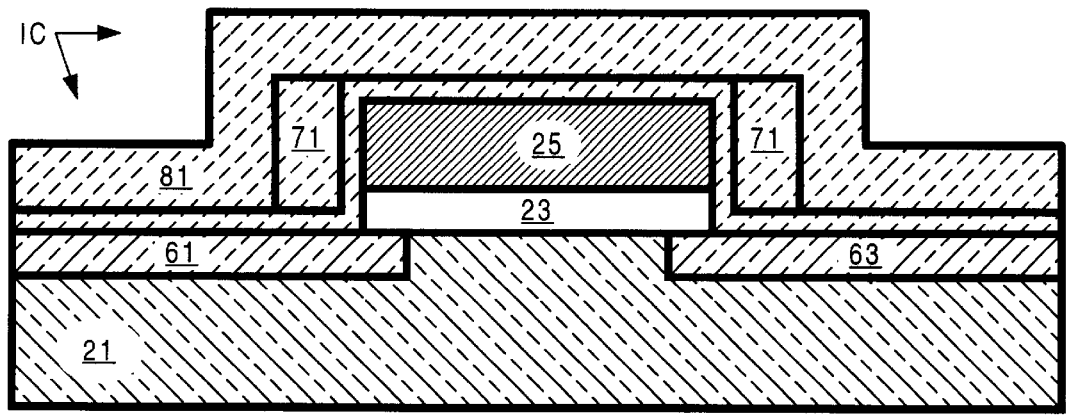

Sidewalls are formed on the gate at step S6. To this end, oxide is deposited over the remaining oxide left after the implants. An anisotropic etch is performed to leave sidewalls 71, shown in FIG. 7. To minimize damage to silicon substrate 21, this etch does not expose crystalline silicon. Left in place are remnants of the extension blocking oxide and the sidewall oxide. However, the thickness of this remnant layer is insufficient to protect the silicon during a subsequent source/drain implant. Accordingly, an additional TEOS deposition is performed at step S7 to define a source/drain blocking layer 81, shown in FIG. 8.

Figure 9:
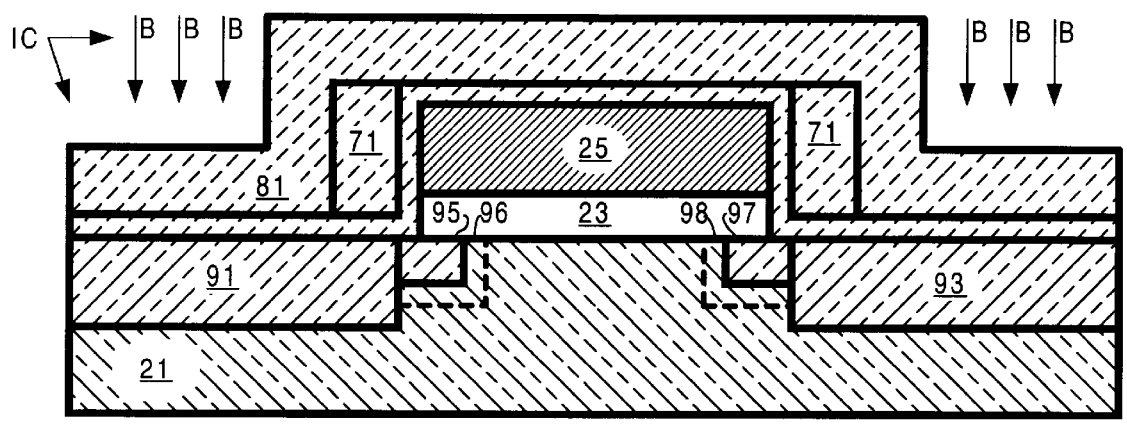

A deep source/drain implant is performed at step S8. This implant uses the same dopants as the extension implants of step S5, but at higher concentrations and energies. This implant defines a heavily doped source section 91 and a heavily doped drain section 93. Step 21 includes a drive-in substep that allows the heavy source/drain implant to diffuse to its final profile. The portions of the extensions not dominated by the dopant from the heavy implant of step 21 define a source extension section 95 (with an associated depletion region 96) and a drain extension section 97 (with an associated depletion region 98). The structure resulting from step S8 is represented in FIG. 9.

The transistor is completed in step S9. Completion of integrated circuit IC conventionally involves deposition of a submetal dielectric, formation of an intermetal dielectric structure for interconnecting transistors, and deposition of a passivation layer.

The present invention provides for many alternatives for the composition and formation of the blocking layer for the PMOS source/drain extension implant. The key is that it provides a higher interstitial recombination rate than would the thermal oxide layer it replaces. The inclusion of carbon in a TEOS deposition appears to be effective in this regard. On the contrary, nitrogen impurities tend to yield a lower interstitial recombination rate.

The invention provides for alternatives in how the carbon or other suitable impurity is introduced. Carbon occurs as an impurity as a matter of course in a TEOS deposition. However, other deposition methods yielding carbon impurities or other impurities that provide for a higher interstitial recombination rate can be used. As a major alternative, the invention provides for a thermal oxide grown in an ambient that results in carbon or other suitable impurity. In this case, the thermal oxide need not be removed before the PMOS source/drain extension implant.

In the illustrated embodiments, the PMOS source/drain dopant is boron. Other p-type dopants can be used instead of or in combination with boron. It is suggested that the relative compactness of the boron atoms makes them respond most favorable to the interstitial flow. However, the diffusion of other p-type dopants can be favorably affected by this flow. These and other variations upon and modification to the described embodiments are provided for by the present invention, the scope of which is defined by the following claims.

What is claimed is:

1. In the fabrication of an integrated circuit, a method comprising the steps of:

growing a thermal silicon dioxide layer on a silicon substrate;

removing said thermal silicon dioxide layer so as to expose said silicon substrate;

depositing a carbon-bearing silicon dioxide layer on the silicon exposed in said removing step; and implanting source/drain dopant through said carbon-bearing silicon dioxide layer and into said silicon substrate.

2. A method as recited in claim 1 wherein said carbon-bearing silicon dioxide layer has an interstitial recombination rate greater than the interstitial recombination rate of said thermal silicon dioxide layer.

3. A method as recited in claim 1 wherein said step of depositing a carbon-bearing silicon dioxide layer involves a TEOS deposition.

4. A method as recited in claim 1 further comprising a step of depositing a third layer of silicon dioxide on said carbon-bearing silicon dioxide.

5. A method as recited in claim 4 further comprising a step of implanting source/drain dopant through said third silicon dioxide layer and said carbon-bearing silicon-dioxide layer and into said silicon substrate.

6. A method as recited in claim 1 wherein said source/drain dopant is p-type.

7. A method as recited in claim 1 further comprising the following steps that precede said step of growing said thermal silicon dioxide layer:

forming a gate oxide layer on a silicon substrate;

depositing a polysilicon layer on said gate oxide layer; and patterning said gate oxide layer and said polysilicon layer to define gate structures.

8. A method as recited in claim 1 further comprising a thermal drive-in step for diffusing said source/drain spacer implant while said thermal silicon dioxide layer is in place.

9. In the fabrication of an integrated circuit having both heavily doped source drain deep regions and lightly doped source/drain extension regions, a method comprising a step of implanting dopant for a p-type source/drain extension region through a carbon-bearing silicon dioxide layer.

10. A method as recited in claim 9 wherein said dopant includes boron.

* * * * *